United States Patent [19]

Sakamoto et al.

[11] Patent Number: 4,897,647
[45] Date of Patent: Jan. 30, 1990

[54] METHOD FOR ABSOLUTE POSITION DETECTION AND AN APPARATUS THEREFORE

[75] Inventors: Keiji Sakamoto; Akihito Nakayama, both of Hachioji, Japan

[73] Assignee: Fanuc Ltd., Minamitsuru, Japan

[21] Appl. No.: 251,377

[22] PCT Filed: Feb. 19, 1988

[86] PCT No.: PCT/JP88/00177
§ 371 Date: Sep. 13, 1988
§ 102(e) Date: Sep. 13, 1988

[87] PCT Pub. No.: WO88/06277
PCT Pub. Date: Aug. 25, 1988

[30] Foreign Application Priority Data
Feb. 21, 1987 [JP] Japan .................. 62-36887

[51] Int. Cl.[4] ............................. H04Q 9/00
[52] U.S. Cl. .................. 340/870.190; 340/870.42; 324/207; 365/228; 377/17; 377/26
[58] Field of Search ............ 340/870.19, 870.30, 340/870.20, 870.31, 870.39, 870.40, 870.42, 686, 687; 324/207, 208, 165; 364/184; 365/228, 229; 377/17, 26, 28, 30, 32

[56] References Cited

U.S. PATENT DOCUMENTS 4,764,767  8/1988  Ichikawa et al. .......... 340/870.31
4,779,075 10/1988  Zägelein et al. .......... 340/870.31
4,795,927  1/1989  Mori et al. ................. 324/208

Primary Examiner—Donald J. Yusko
Assistant Examiner—Tyrone Queen
Attorney, Agent, or Firm—Staas & Halsey

[57] ABSTRACT

There are provided a method and an apparatus for absolute position detection, in which position detection is performed with high accuracy by interpolation between feedback pulses generated as an object of position detection moves, and the power-on command displacement can be calculated with high accuracy, the method and the apparatus entailing only small electric power consumption. A stored value in an absolute counter (2), which is indicative of an approximate absolute position of an object of position detection, is updated each time a feedback pulse is generated from a feedback pulse generating circuit (1), and is retentively stored in the counter even after the power is turned off. As the object of position detection moves, moreover, the count value of interpolation pulses, generated during the time interval which elapses from the instant that the power is turned on again until the first one of the feedback pulses is generated, is temporarily stored in a correction counter (5). The power-on absolute position of the object of position detection is calculated by means of a numerical control unit (20), in accordance with the stored value, the count value, and the moving direction designated by a movement command delivered when the power is turned on. Further, the apparatus calculates the command displacement on the basis of the calculated absolute position and a command target position.

12 Claims, 2 Drawing Sheets

METHOD FOR ABSOLUTE POSITION DETECTION AND AN APPARATUS THEREFORE

TECHNICAL FIELD

The present invention relates to absolute position detection in which position detection is performed with high accuracy by interpolation between feedback pulses generated as an object of position detection moves, and more particularly, to a method and an apparatus for absolute position detection, in which the command displacement upon application of power supply can be calculated with high accuracy, the method and the apparatus entailing only small electric power consumption.

BACKGROUND ART

In an absolute positioning system in which pulses of a quantity corresponding to a command displacement, which is obtained by subtracting the present absolute position from a command absolute position, are delivered to effect positioning control, if the present position upon application of power supply is unknown, a reference point return operation must be performed, since the command displacement cannot be precisely calculated on the basis of the command absolute position only. In order to obviate such an awkward situation, as is conventionally known, an absolute position detector, e.g., an absolute pulse encoder, may be subjected to battery-backup so that a detected absolute position upon termination of power supply is retentively stored even after the power is turned off, and the reference point return operation when the power is turned on again can be omitted. As is also conventionally known, feedback pulses, which are generated from a pulse encoder as an object of position detection moves, may be divided by means of interpolation pulses, thereby improving the detection resolution.

However, if an absolute counter and an interpolation counter for counting the feedback pulses and the interpolation pulses, respectively, are both subjected to battery-backup, in order to obtain the advantages of both these prior art arrangements, substantial electric power consumption is required, that is, the system is uneconomical.

DISCLOSURE OF THE INVENTION

The object of the present invention is to provide a method and an apparatus for absolute position detection which permits high-accuracy calculation of a command displacement when the power is on, and entails less electric power consumption.

In order to achieve the above object, a method for absolute position detection according to the present invention comprises steps of: (a) generating a feedback pulse having a polarity corresponding to the moving direction of an object of position detection each time the object of position detection moves for a first predetermined distance; (b) updating a stored value indicative of an approximate absolute position of the object of position detection each time the feedback pulse is generated; (c) generating an interpolation pulse each time the object of position detection moves for a second predetermined distance shorter than the first predetermined distance; (d) storing and retaining the stored value even after the power is turned off; (e) counting the interpolation pulses generated during the time interval which elapses from the instant that the power is turned on again until the first one of the feedback pulses is generated, and temporarily storing the count value obtained; (f) calculating the absolute position of the object of position detection reached when the power is turned on again, in accordance with the stored value retentively stored in the step (d), the count value of the interpolation pulses stored in the step (e), the first and second predetermined distances, and the moving direction designated by a movement command delivered when the power is turned on again.

An apparatus for absolute position detection according to the present invention comprises: a first pulse generating means for generating a feedback pulse having a polarity corresponding to the moving direction of an object of position detection each time the object of position detection moves for a first predetermined distance; second pulse generating means for generating an interpolation pulse each time the object of position detection moves for a second predetermined distance shorter than the first predetermined distance; an absolute counter subject to battery-backup and adapted to update a stored value each time the feedback pulse from the first pulse generating means is inputted; an interpolation counter for counting interpolation pulses supplied from the second pulse generating means and temporarily storing the count value obtained; and a correction counter adapted to receive and temporarily store the count value stored in the interpolation counter when the feedback pulse is generated. Preferably, the position detecting apparatus is used with built-in or external calculating means, which calculates the absolute position of the object of position detection reached when the power is turned on again, when the first one of the feedback pulses is generated after the power is turned on again, in accordance with the stored value in the absolute counter, the count value stored in the correction counter, the first and second predetermined distances, and the moving direction designated by a movement command delivered when the power is turned on again.

According to the present invention, as described above, the power-on absolute position of the object of position detection is detected in accordance with the respective count values of the feedback pulses and the interpolation pulses. Thus, the power-on absolute position of the object of position detection can be calculated with high accuracy, so that the command displacement can be calculated directly on the basis of this calculated absolute position and a command absolute position, and positioning control can be effected without performing a reference point return operation. Also, only the count value of the feedback pulses is retentively stored when the power is off, so that there may be provided an absolute position detecting apparatus which requires only small electric power consumption, and is low-priced and small-sized.

BEST MODE OF CARRYING OUT THE INVENTION

Figure 1:
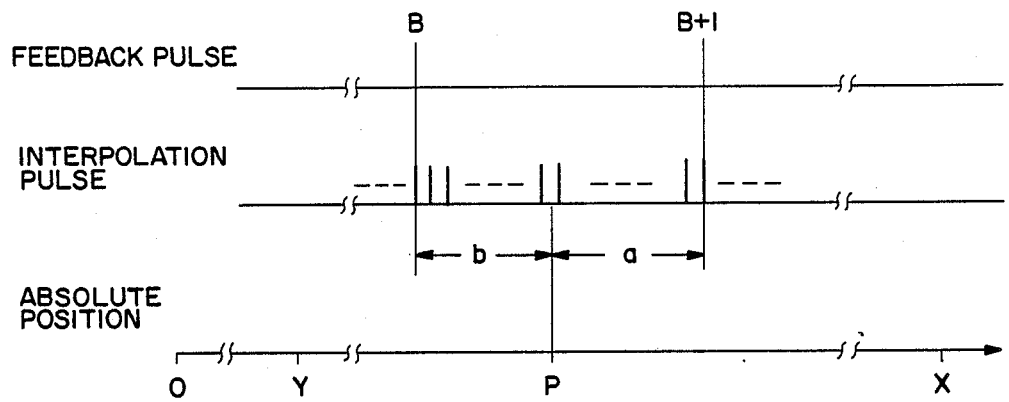
FIG. 1 is a diagram for illustrating the principle of position detection according to the present invention.

Referring first to FIG. 1, the principle of absolute position detection according to the present invention will be described.

Each time an object of positioning control, i.e., an object of position detection, moves for first and second predetermined distances k and m (where m=k/N (N is the number of interpolation pulses generated within the predetermined distance k)), feedback pulses and interpolation pulses generated are counted. Only the count number of the feedback pulses, approximately indicative of a power-off absolute position P of the object of position detection, is retentively stored even after the power is turned off, so that the accurate power-off absolute position P temporarily becomes unknown.

Thereafter, the power is turned on again, and a command is delivered to move the object of position detection to a target absolute position X of a value larger than that of the detected approximate position, that is, in the positive direction, for example. Thereupon, the interpolation pulses generated as the object of position detection moves in response to the movement command and counted until the first feedback pulse B+1 after the power is turned on is generated, and the number a of the generated pulses is stored. Using the stored value a corresponding to the number b (where b=N−a) of interpolation pulses generated during the time interval which elapses from the instant that the last feedback pulse B in the preceding positioning control is generated until the power is turned off, the number b being indicative of the difference between the absolute position P and the detected approximate position, that is, according to a predetermined calculation equation P=Bk+(N−a)m, the absolute position P of the object of position detection obtained when the power is turned off or when the power is turned on is calculated accurately. Based on the calculated value P and the target position X, the number of command pulses can be calculated accurately.

Meanwhile, if the movement command delivered when the power is turned on again is intended to move the object of position detection in the negative direction to a target absolute position Y, the power-on absolute position P is calculated according to a second predetermined calculation equation P=Bk+bm, on the basis of the interpolation pulse number b obtained when the first feedback pulse B is generated.

Figure 2:
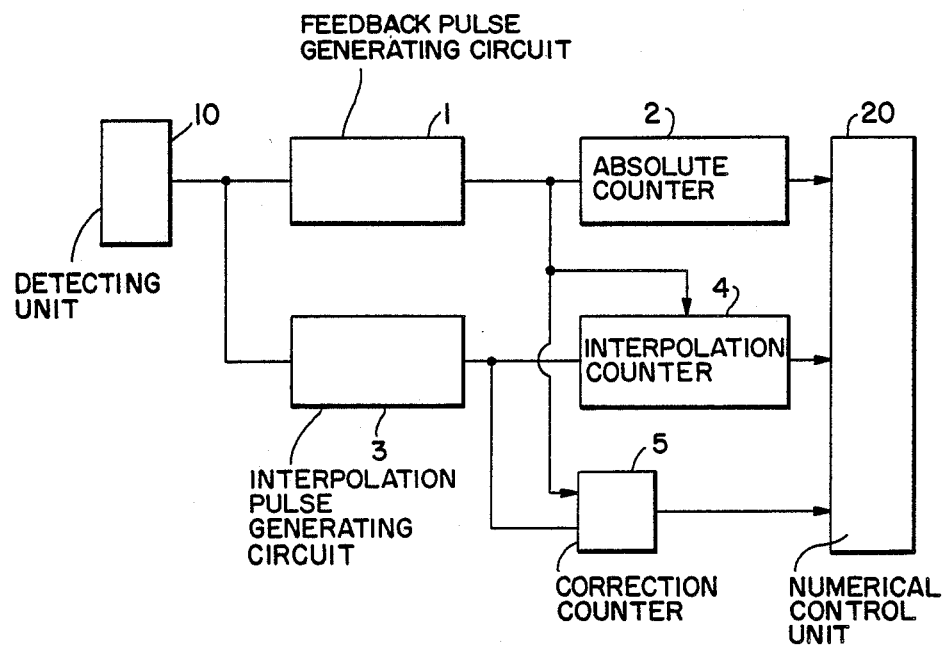
FIG. 2 is a schematic view showing an absolute position detecting apparatus according to one embodiment of the present invention.

FIG. 2 shows an absolute position detecting apparatus according to an embodiment of the present invention. This position detecting apparatus comprises a position detecting unit 10 of, e.g., an optical type, which is operatively coupled to an object of position detection (not shown). The detecting unit 10 is arranged so as to deliver a feedback wave (not shown) composed of two sine-wave signals which are generated individually with a period corresponding to the movement of the object of position detection for the first predetermined distance, e.g., 2 μm, and whose phases are deviated at an angle of 90° from each other. The respective feedback wave input terminals of a feedback pulse generating circuit 1 and an interpolation pulse generating circuit 3 are connected to a feedback wave output terminal of the detecting unit 10. The feedback pulse generating circuit 1 is provided so as to generate feedback pulses (two of which are designated by symbols B and B+1 in FIG. 3) of polarity corresponding to the moving direction of the object of detection, with the same period for the feedback wave, that is, each time the object of detection moves for 2 μm. On the other hand, the interpolation pulse generating circuit 3 is provided so as to generate interpolation pulses (designated by symbols C0, C1, C2, - - -, C19 in FIG. 3) of polarity corresponding to the moving direction of the object of detection, each time the object of detection moves for the second predetermined distance, e.g., 0.1 μm.

The position detecting apparatus further comprises an absolute counter 2, an interpolation pulse counter 4, and a correction counter 5. The absolute counter 2 has a feedback pulse input terminal connected to the output terminal of the feedback pulse generating circuit 1, and serves to count feedback pulse supplied from the circuit 1. The interpolation pulse counter 4 has a reset signal input termiinal and an interpolation pulse input terminal connected to the input terminals of the circuits 1 and 3, respectively, and serves to count interpolation pulses. The correction counter 5 has a strobe signal input terminal and an interpolation pulse input terminal connected to the input terminals of the circuits 1 and 3, respectively, and serves to temporarily store the number of interpolation pulses supplied from the circuit 3 until the feedback pulses are generated. The absolute counter 2 enjoys battery-backup. Furthermore, the position detecting apparatus is connected to a numerical control unit 20, as external calculating means, which receives count values of counters 2, 4 and 5, and calculates the power-on absolute value of the object of position detection, as mentioned later. Since the elements 1 to 5, 10 and 20 can be composed of conventional means, a detailed description thereof is omitted herein. In order to obtain required operation timings, suitable circuit means (not shown) are provided between the elements 1 and 4 and between the elements 1 and 5.

The following is a description of the operation of the position detecting apparatus of the aforementioned construction.

Figure 3:
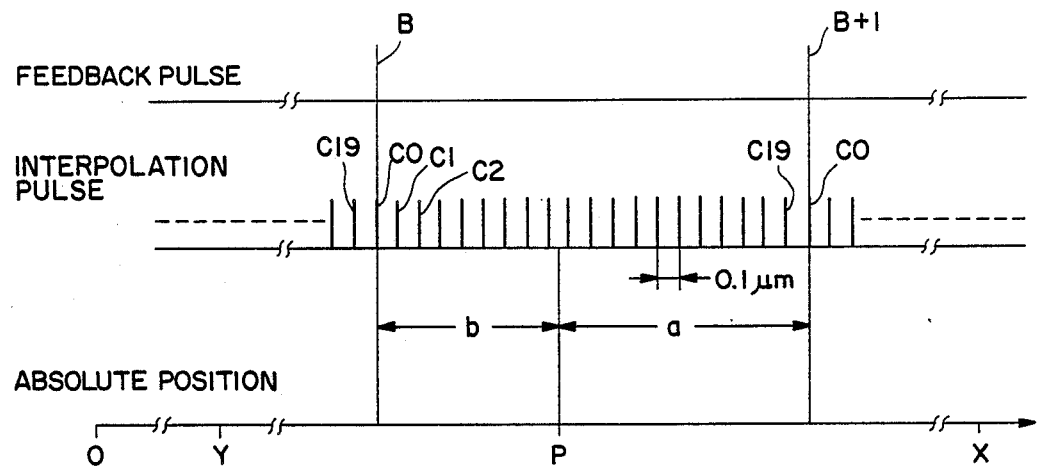
FIG. 3 is a diagram illustrating the operation of the apparatus of FIG. 2.

Here let it be supposed that the power is off, the object of position detection is in the absolute position designated by symbol P in FIG. 3, and the absolute counter 2 is stored with a count value B, e.g., 100, which indicates that the absolute position P is within the region between B and B+1 (200 μm<P<202 μm). In addition, the stored values in the interpolation pulse counter 4 and the correction counter 5, which are not subject to battery-backup, are reset to a value "0" when the power is off.

When the power is turned on in such a state, the numerical control unit 20 starts executing the movement command for moving the object of position detection to the target position, e.g., for moving the object in the positive direction to the absolute position X (e.g., X=220 μm) whose value is greater than that of the present approximate absolute position (e.g., 200 μm), and also reads the stored value B (e.g., B=100) in the absolute counter 2. As the object of position detection moves correspondingly, two sine-wave signals are outputted from the detecting unit 10 of the position detecting apparatus. Each time the object of position detection moves for the second predetermined distance, e.g., 0.1 μm, an interpolation pulse is delivered from the interpolation pulse generating circuit 3 which receives those sine-wave signals. Every time each interpolation pulse is supplied, the count values in the interpolation pulse counter 4 and the correction counter 5, which individually receive the interpolation pulse, are incremented.

Thereafter, when the first feedback pulse (designated by symbol B+1 in FIG. 3) is generated from the feedback pulse generating circuit 1, which receives the sine-wave signals from the detecting unit 10, after the power is turned on, this feedback pulse is supplied to the reset signal input terminal of the interpolation pulse counter 4 and the strobe signal input terminal of the correction counter 5 with a required timing. Thus, the counted value (designated by symbol a in FIG. 3) stored in the correction counter 5 when the feedback pulse is generated is latched in the correction counter, and the interpolation pulse counter 4 is then reset.

When the numerical control unit 20 discriminates the generation of the first feedback pulse B+1, it calculates the power-on absolute position P of the object of position detection, in accordance with the predetermined calculation equation (in this case, the calculation equation $P=Bk+(N-a)m$ corresponding to the positive moving direction) corresponding to the moving direction of the object of position detection, which is determined by the relationship between the movement target position X (=220 $\mu$m) and the absolute position (=200 $\mu$m) corresponding to the absolute counter value B read when the power is on, and with use of the value a read from the correction counter 5 and the preset parameter values k, N, and m. If the values a, k, N, and m are 11, 2 $\mu$m, 20, and 0.1 $\mu$m, respectively, the calculated value of the power-on absolute position P of the object of position detection is 200.9 $\mu$m. The numerical control unit 20 operates so as to deliver command pulses of quantity corresponding to the differences (19.1 $\mu$m) between the command position X (=220 $\mu$m) and the calculated absolute position P (=200.9 $\mu$m). In response to the feedback pulses and interpolation pulses generated as the object of position detection moves, the stored values in the absolute counter 2 and the interpolation pulse counter 4 are updated, respectively, and the stored value in the counter 4 is reset with the generation of each feedback pulse. Based on a resultant output from the two counters 2 and 4, the numerical control unit 20 monitors the actual absolute position of the object of position control, and determines the arrival at the command position.

Substantially the same position detection is executed also when the movement command is delivered to move the object in the negative direction to the absolute position Y (e.g., Y=150 $\mu$m) whose value is smaller than that of the present approximate absolute position (e.g., 200 $\mu$m).

Thus, when the numerical control unit 20 discriminates the generation of the first feedback pulse B, it calculates the power-on absolute position P (=200.8 $\mu$m) of the object of position detection, in accordance with the second predetermined calculation equation $P=Bk+bm$ corresponding to the negative moving direction of the object of position detection, which is determined by the relationship between the movement target position Y (=150 $\mu$m) and the absolute position (=200 $\mu$m) corresponding to the absolute counter value B read when the power is on, and with use of the values B (=100) and b (=8) read from the absolute counter 2 and the correction counter 5 and the preset parameter values k (=2 $\mu$m) and m (=0.1 $\mu$m), and delivers command pulses of a quantity corresponding to the difference (50.8 $\mu$m) between the command position X (=150 $\mu$m) and the calculated absolute position P.

In the apparatus of the embodiment described above, the absolute position of the object of position detection, when and after the power is turned on, is calculated by means of the numerical control unit 20, on the basis of the outputs from the corresponding counters. Alternatively, however, calculating means (not shown), which is contained in the absolute position detecting apparatus and having the required calculating function, may be used for this purpose.

We claim:
1. A method for absolute position detection comprising steps of:
 (a) generating a feedback pulse having a polarity corresponding to the moving direction of an object of position detection each time said object of position detection moves for a first predetermined distance;
 (b) updating a stored value indicative of an approximate absolute position of said object of position detection each time said feedback pulse is generated;
 (c) generating an interpolation pulse each time said object of position detection moves for a second predetermined distance shorter than said first predetermined distance;
 (d) storing and retaining said stored value even after the power is turned off;
 (e) counting said interpolation pulses generated during the time interval which elapses from the instant that the power is turned on again until the first one of said feedback pulses is generated, and temporarily storing the count value obtained;
 (f) calculating the absolute position of said object of position detection reached when the power is turned on again, in accordance with said stored value retentively stored in said step (d), the count value of said interpolation pulses stored in said step (e), said first and second predetermined distances, and the moving direction designated by a movement command delivered when the power is turned on again.

2. A method for absolute position detection according to claim 1, wherein said absolute position is calculated in said step (f) in accordance with the moving direction designated by the movement command delivered when the power is turned on again, and according to either of first and second predetermined calculation equations as functions of said stored value, the count value of said interpolation pulses, and said first and second predetermined distances.

3. A method for absolute position detection according to claim 2, wherein said moving direction is determined on the basis of a target absolute position designated by the movement command delivered when the power is turned on again and said stored value obtained when the power is turned on again.

4. A method for absolute position detection according to claim 3, wherein a calculation equation $P=Bk+(N-a)m$, where P is the absolute position obtained when the power is turned on again, B is said stored value retentively stored in said step (d), a is the count value of said interpolation pulses stored in said step (e), and k and m are said first and second predetermined distances, respectively, wherein the equation for P is used as said first predetermined calculation equation in step (f) when the value of the target absolute position designated by the movement command delivered when the power is turned on again is greater than said stored value obtained when the power is turned on again.

5. A method for absolute position detection according to claim 3, wherein a calculation equation $P=Bk+bm$, where P is the absolute position obtained when the power is turned on again, B is said stored value retentively stored in said step (d), b is the count value of said interpolation pulses stored in said step (e), and k and m are said first and second predetermined distances, respectively wherein the equation for P is used as said second predetermined calculation equation in step (f) when the value of the target absolute position designated by the movement command delivered when the power is turned on again is smaller than said stored value obtained when the power is turned on again.

6. An apparatus for absolute position detection, comprising:
   first pulse generating means for generating a feedback pulse having a polarity corresponding to the moving direction of an object of position detection each time said object of position detection moves for a first predetermined distance;
   second pulse generating means for generating an interpolation pulse each time said object of position detection moves for a second predetermined distance shorter than said first predetermined distance;
   an absolute counter subject to battery-backup when power is turned off and adapted to update a stored value each time said feedback pulse from said first pulse generating means is inputted;
   an interpolation counter for counting interpolation pulses supplied from said second pulse generating means and temporarily storing the count value obtained; and
   a correction counter adapated to receive and temporarily store the count value stored in said interpolation counter when the said feedback pulse is generated.

7. An apparatus for absolute position detection according to claim 6, further comprising calculating means for calculating the absolute position of said object of position detection reached when the power is turned on again, when the first one of said feedback pulses is generated after the power is turned on again, in accordance with the count values stored individually in said absolute counter and said correction counter, said first and second predetermined distances, and the moving direction designated by a movement command delivered when the power is turned on again.

8. An apparatus for absolute position detection according to claim 6, wherein said apparatus is adapted to be connected to external calculating means for calculating the absolute position of said object of position detection reached when the power is turned on again, when said feedback pulse is first generated after the power is turned on again, in accordance with the count values stored individually in said absolute counter and said correction counter, said first and second predetermined distances, and the moving direction designated by a movement command delivered when the power is turned on again.

9. An apparatus for absolute position detection according to claim 7 or 8, wherein said calculating means calculates the absolute position in accordance with the moving direction designated by the movement command delivered when the power is turned on again, and according to either of first and second predetermined calculation equations as functions of the count value of said absolute counter, the count value of said correction counter, and said first and second predetermined distances.

10. An apparatus for absolute position detection according to claim 7 or 8, wherein said calculating means determines said moving direction on the basis of a target absolute position designated by the movement command delivered when the power is turned on again and the count value of said feedback pulses stored when the power is turned on again.

11. An apparatus for absolute position detection according to claim 10, wherein said calculating means uses a calculation equation $P=Bk+(N-a)m$, where P is the absolute position of said object of detection obtained when the power is turned on again, B and a are the count values stored in said absolute counter and said correction counter, respectively, when the power is turned on again, and k and m are said first and second predetermined distances, respectively, wherein the equation for P is used as said first predetermined calculation equation when the value of the target absolute position designated by the movement command delivered when the power is turned on again is greater than the count value of said feedback pulses stored when the power is turned on again.

12. An apparatus for absolute position detection according to claim 10, wherein said calculating means uses a calculation equation $P=Bk+bm$, where P is the absolute position of said object of detection obtained when the power is turned on again, B and a are the count values stored in said absolute counter and said correction counter, respectively, when the power is turned on again, and k and m are said first and second predetermined distances, respectively, wherein the equation for P is used as said second predetermined calculation equation when the value of the target absolute position designated by the movement command delivered when the power is turned on again is smaller than the count value of said feedback pulses stored when the power is turned on again.

* * * * *